US012033688B2

(12) United States Patent
Chi

(10) Patent No.: US 12,033,688 B2
(45) Date of Patent: *Jul. 9, 2024

(54) SENSE AMPLIFICATION STRUCTURE AND MEMORY ARCHITECTURE

(71) Applicant: CHANGXIN MEMORY TECHNOLOGIES, INC., Hefei (CN)

(72) Inventor: Sungsoo Chi, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 157 days.

This patent is subject to a terminal disclaimer.

(21) Appl. No.: 17/812,032

(22) Filed: Jul. 12, 2022

(65) Prior Publication Data

US 2023/0061421 A1 Mar. 2, 2023

Related U.S. Application Data

(63) Continuation of application No. PCT/CN2022/094359, filed on May 23, 2022.

(30) Foreign Application Priority Data

Aug. 27, 2021 (CN) .......................... 202110998262.1

(51) Int. Cl.
*G11C 7/10* (2006.01)
*G11C 11/408* (2006.01)
(Continued)

(52) U.S. Cl.
CPC ...... *G11C 11/4091* (2013.01); *G11C 11/4085* (2013.01); *G11C 11/4094* (2013.01); *G11C 11/4096* (2013.01)

(58) Field of Classification Search
CPC ............ G11C 11/4091; G11C 11/4085; G11C 11/4094; G11C 11/4096
See application file for complete search history.

(56) References Cited

U.S. PATENT DOCUMENTS 10,224,093 B2   3/2019   Kim et al.
11,581,034 B1*  2/2023   Chi ..................... G11C 11/4097
(Continued)

FOREIGN PATENT DOCUMENTS

CN   112712837 A   4/2021
CN   112767975 A   5/2021

OTHER PUBLICATIONS

International Search Report cited in PCT/CN2022/094359 mailed Aug. 9, 2022, 9 pages.

*Primary Examiner* — Min Huang
(74) *Attorney, Agent, or Firm* — Kilpatrick Townsend & Stockton LLP

(57) ABSTRACT

The present disclosure provides a sense amplification structure and a memory architecture. The sense amplification structure includes: a first PMOS transistor provided with a gate connected to a second readout bit line and a source connected to a first signal terminal; a first NMOS transistor provided with a gate connected to an initial bit line; a drain of the first PMOS transistor and a drain of the first NMOS transistor being connected to a first complementary readout bit line; a second PMOS transistor provided with a gate connected to the second complementary readout bit line; a second NMOS transistor provided with a gate connected to an initial complementary bit line and a source connected to a second signal terminal; a drain of the second PMOS transistor and a drain of the second NMOS transistor being connected to the first readout bit line.

16 Claims, 2 Drawing Sheets

(51) Int. Cl.
*G11C 11/4091* (2006.01)
*G11C 11/4094* (2006.01)
*G11C 11/4096* (2006.01)

(56) References Cited

U.S. PATENT DOCUMENTS

2003/0057520 A1* 3/2003 Kawasumi ............. G11C 7/065
 257/553
2015/0357021 A1 12/2015 Hush
2018/0182449 A1* 6/2018 Kim .................... G11C 11/4091

* cited by examiner

SENSE AMPLIFICATION STRUCTURE AND MEMORY ARCHITECTURE

CROSS-REFERENCE TO RELATED APPLICATIONS

This is a continuation of International Application No. PCT/CN2022/094359, filed on May 23, 2022, which claims the priority to Chinese Patent Application No. 202110998262.1, titled "SENSE AMPLIFICATION STRUCTURE AND MEMORY ARCHITECTURE" and filed on Aug. 27, 2021. The entire contents of International Application No. PCT/CN2022/094359 and Chinese Patent Application No. 202110998262.1 are incorporated herein by reference.

TECHNICAL FIELD

The present disclosure relates to, but is not limited to, a sense amplification structure and a memory architecture.

BACKGROUND

A dynamic random access memory (DRAM) writes data through electric charge in a cell capacitor; the cell capacitor is connected to a bit line and a complementary bit line. In the DRAM, when a read operation or a refresh operation is performed, a readout amplifier reads and amplifies a voltage difference between the bit line and the complementary bit line.

Semiconductor devices forming a readout amplifier may have different device characteristics (e.g., threshold voltage) due to factors such as a process change and temperature. Different device characteristics may cause an offset noise in the readout amplifier, while the offset noise reduces the effective readout margin of the readout amplifier and reduces the performance of the DRAM.

The applicant found that in the current process of eliminating the offset noise in the DRAM, the bit line is electrically connected to a complementary readout bit line, the complementary bit line is electrically connected to a readout bit line, and therefore, the offset noise is canceled through the voltage difference between the bit line and the complementary bit line. However, since a gate of a P-channel metal oxide semiconductor (PMOS) transistor in a sense amplification circuit is connected to the readout bit line and the complementary readout bit line, respectively, it is easy to cause voltage fluctuations of the readout bit line and the complementary readout bit line, thereby affecting the voltage of the bit line and the voltage of the complementary bit line, reducing the readout accuracy of the DRAM, and reducing the performance of the DRAM.

SUMMARY

An overview of the subject matter detailed in the present disclosure is provided below, which is not intended to limit the protection scope of the claims.

The present disclosure provides a sense amplification structure and a memory architecture.

A first aspect of the present disclosure provides a sense amplification structure, provided between two adjacent memory arrays. The sense amplification structure includes:
a first PMOS transistor provided with a gate connected to a second readout bit line and a source connected to a first signal terminal;
a first N-channel metal oxide semiconductor (NMOS) transistor provided with a gate connected to an initial bit line and a source connected to a second signal terminal;
a drain of the first PMOS transistor and a drain of the first NMOS transistor being connected to a first complementary readout bit line, wherein the first signal terminal is configured to receive a first level signal, and the second signal terminal is configured to receive a second level signal;
a second PMOS transistor provided with a gate connected to the second complementary readout bit line and a source connected to the first signal terminal;
a second NMOS transistor provided with a gate connected to an initial complementary bit line and a source connected to the second signal terminal;
a drain of the second PMOS transistor and a drain of the second NMOS transistor being connected to the first readout bit line, wherein the initial bit line is connected to a memory cell in one of the two adjacent memory arrays, and the initial complementary bit line is connected to a memory cell in the other of the two adjacent memory arrays; an offset cancellation component partially connected between the initial bit line and the first complementary readout bit line, partially connected between the initial complementary bit line and the first readout bit line, and configured to electrically connect the initial bit line to the first complementary readout bit line and electrically connect the initial complementary bit line to the first readout bit line according to an offset canceling signal; and
a control component connected to the second readout bit line and the second complementary readout bit line, and configured to provide a bias voltage to the first PMOS transistor and the second PMOS transistor according to a control signal.

A second aspect of the present disclosure provides a memory architecture, including:
a plurality of memory arrays arranged in an initial bit line extension direction and a word line extension direction, the initial bit line extension direction being perpendicular to the word line extension direction;
a sense amplification structure according to any embodiment of the first aspect, provided between two adjacent ones of the memory arrays in the initial bit line extension direction,
wherein the sense amplification structure is connected to a memory cell in one of the two adjacent memory arrays through an initial bit line, and is connected to a memory cell in the other of the two adjacent memory arrays through an initial complementary bit line; and
a control component provided between the two adjacent memory arrays in the word line extension direction, and configured to provide a data readout signal, a control signal, and a bias voltage to the sense amplification structure.

Other aspects of the present disclosure are understandable upon reading and understanding of the accompanying drawings and detailed description.

BRIEF DESCRIPTION OF THE DRAWINGS

The accompanying drawings incorporated into the specification and constituting part of the specification illustrate the embodiments of the present disclosure, and are used together with the description to explain the principles of the embodiments of the present disclosure. In these accompanying drawings, similar reference numerals are used to represent similar elements. The accompanying drawings in the following description are some rather than all of the embodiments of the present disclosure. Those skilled in the art may derive other accompanying drawings based on these accompanying drawings without creative efforts.

DETAILED DESCRIPTION

Figure 1:
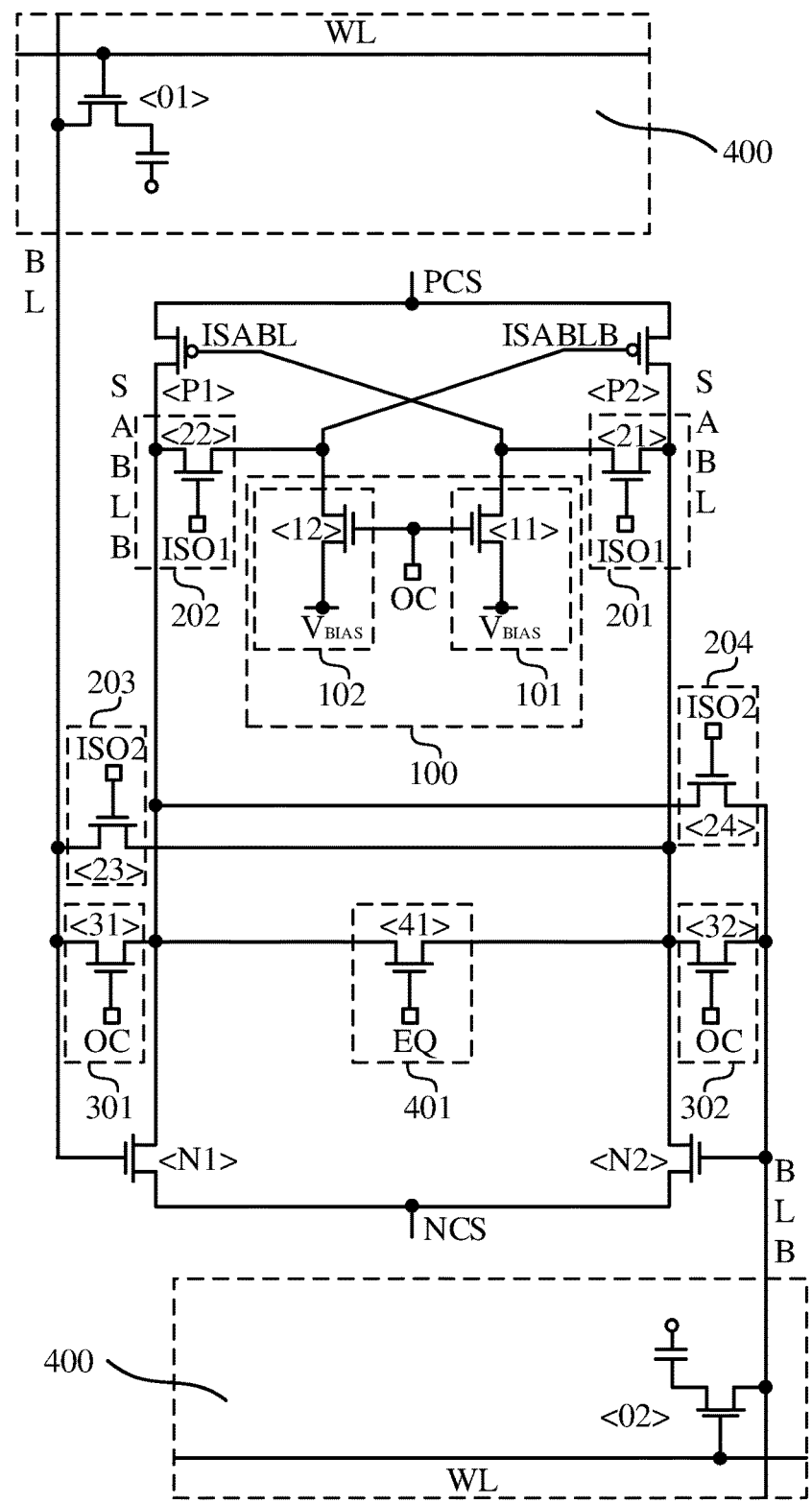
FIG. 1 is a schematic diagram of a circuit structure of a sense amplification structure according to one embodiment of the present disclosure.

The technical solutions in the embodiments of the present disclosure are described below clearly and completely with reference to the accompanying drawings in the embodiments of the present disclosure. Apparently, the described embodiments are merely some rather than all of the embodiments of the present disclosure. All other embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

In the current process of eliminating an offset noise in a DRAM, a bit line is electrically connected to a complementary readout bit line, a complementary bit line is electrically connected to a readout bit line, and therefore, the offset noise is canceled through a voltage difference between the bit line and the complementary bit line. However, since a gate of a PMOS transistor in a sense amplification circuit is connected to the readout bit line and the complementary readout bit line, respectively, it is easy to cause voltage fluctuations of the readout bit line and the complementary readout bit line, thereby affecting the voltage of the bit line and the voltage of the complementary bit line, reducing the readout accuracy of the DRAM, and reducing the performance of the DRAM.

Therefore, how to stably cancel the offset noise in the sense amplification circuit while avoiding the voltage fluctuations of the bit line and the complementary bit line is an urgent problem to be solved at present.

One embodiment of the present disclosure provides a sense amplification structure, provided between two adjacent memory arrays. The sense amplification structure includes: a first PMOS transistor provided with a gate connected to a second readout bit line and a source connected to a first signal terminal; a first NMOS transistor provided with a gate connected to an initial bit line and a source connected to a second signal terminal; a drain of the first PMOS transistor and a drain of the first NMOS transistor being connected to a first complementary readout bit line, where the first signal terminal is configured to receive a first level signal, and the second signal terminal is configured to receive a second level signal; a second PMOS transistor provided with a gate connected to the second complementary readout bit line and a source connected to the first signal terminal; a second NMOS transistor provided with a gate connected to an initial complementary bit line and a source connected to the second signal terminal; a drain of the second PMOS transistor and a drain of the second NMOS transistor being connected to the first readout bit line, where the initial bit line is connected to a memory cell in one of the two adjacent memory arrays, and the initial complementary bit line is connected to a memory cell in the other of the two adjacent memory arrays; an offset cancellation component partially connected between the initial bit line and the first complementary readout bit line, partially connected between the initial complementary bit line and the first readout bit line, and configured to electrically connect the initial bit line to the first complementary readout bit line and electrically connect the initial complementary bit line to the first readout bit line according to an offset canceling signal; and a control component connected to the second readout bit line and the second complementary readout bit line, and configured to provide a bias voltage to the first PMOS transistor and the second PMOS transistor according to a control signal.

FIG. 1 is a schematic diagram of a circuit structure of a sense amplification structure according to this embodiment. The sense amplification structure provided in each embodiment of the present disclosure is further described below in detail with reference to the accompanying drawings, and the details are as follows:

Referring to FIG. 1, the sense amplification structure, provided between the two adjacent memory arrays 400, includes:

The first PMOS transistor <P1> is provided with the gate connected to the second readout bit line ISABL and the source connected to the first signal terminal, where the first signal terminal is configured to receive the first level signal (positive cell storing signal (PCS)).

The first NMOS transistor <N1> is provided with the gate connected to the initial bit line BL and the source connected to the second signal terminal, where the second signal terminal is configured to receive the second level signal (negative cell storing signal (NCS)).

The drain of the first PMOS transistor <P1> and the drain of the first NMOS transistor <N1> are connected to the first complementary readout bit line SABLB.

In this embodiment, the voltage of the first level signal PCS is greater than the voltage of the second level signal NCS. That is, the first level signal PCS is at a high level corresponding to logic "1", and the second level signal NCS is at a low level corresponding to logic "0".

The second PMOS transistor <P2> is provided with the gate connected to the second complementary readout bit line ISABLB and the source connected to the first signal terminal.

The second NMOS transistor <N2> is provided with the gate connected to the initial complementary bit line BLB and the source connected to the second signal terminal.

The drain of the second PMOS transistor <P2> and the drain of the second NMOS transistor <N2> are connected to the first readout bit line SABL.

For the initial bit line BL and the initial complementary bit line BLB, the initial bit line BL is connected to the memory cell in one of the two adjacent memory arrays 400, and the initial complementary bit line is connected to the memory cell in the other of the two adjacent memory arrays 400.

In this embodiment, referring to FIG. 1, the initial bit line BL is connected to a first memory cell through a first switching tube <01>, and the initial complementary bit line BLB is connected to a second memory cell through a second switching tube <02>.

For the first switching tube <01> and the second switching tube <02>, the first switching tube <01> is provided with a gate connected to a word line WL, a source connected to the initial bit line BL, and a drain connected to the first memory cell, and the second switching tube <02> is provided with a gate connected to the word line WL, a source connected to the initial complementary bit line BLB, and a drain connected to the second memory cell.

The word line WL is turned on based on a row selection signal. When the word line WL is turned on, the switching tube connected to the word line WL is turned on, an electrical charge in the memory cell is shared onto the initial bit line BL or the initial complementary bit line BLB, and the initial bit line BL or the initial complementary bit line BLB is turned on based on a column selection signal. When the initial bit line BL or the initial complementary bit line BLB is turned on, a memory reads out data.

The offset cancellation component is partially connected between the initial bit line BL and the first complementary readout bit line SABLB, partially connected between the initial complementary bit line BLB and the first readout bit line SABL, and configured to electrically connect the initial bit line BL to the first complementary readout bit line SABLB and electrically connect the initial complementary bit line BLB to the first readout bit line SABL according to the offset canceling signal (OC).

The control component 100 is connected to the second readout bit line ISABL and the second complementary readout bit line ISABLB, and is configured to provide the bias voltage VBIAS to the first PMOS transistor <P1> and the second PMOS transistor <P2> according to the control signal.

When the control component 100 is turned on based on the control signal, the bias voltage VBIAS is provided to the gate of the first PMOS transistor <P1> and the gate of the second PMOS transistor <P2>, the first PMOS transistor <P1> is turned on based on the bias voltage VBIAS, the first signal terminal is electrically connected to the first complementary readout bit line SABLB, the first level signal PCS is transmitted to the first complementary readout bit line SABLB, the second PMOS transistor <P2> is turned on based on the bias voltage VBIAS, the first signal terminal is electrically connected to the first readout bit line SABL, and the first level signal PCS is transmitted to the first readout bit line SABL, thereby canceling offsets of the PMOS transistors. After the offset cancellation component is turned on based on the offset canceling signal OC, the initial bit line BL and the first complementary readout bit line SABLB are electrically connected and share a voltage, the initial complementary bit line BLB and the first readout bit line SABL are electrically connected and share a voltage, the voltage of the initial bit line BL serves as a gate voltage of the first NMOS transistor <N1> for turning on the first NMOS transistor <N1>, the second signal terminal is electrically connected to the first complementary readout bit line SABLB, the second level signal NCS is transmitted to the first complementary readout bit line SABLB, the voltage of the initial complementary bit line BL serves as a gate voltage of the second NMOS transistor <N2> for turning on the second NMOS transistor <N2>, the second signal terminal is electrically connected to the first readout bit line SABL, and the second level signal NCS is transmitted to the first readout bit line SABL, thereby canceling offsets of the NMOS transistors. The first PMOS transistor <P1> and the second PMOS transistor <P2> are turned on based on a stable bias voltage VBIAS, i.e., keeping the voltage of the first readout bit line SABL and the voltage of the first complementary readout bit line SABLB stable, thereby further stabilizing the voltage of the initial bit line BL and the voltage of the initial complementary bit line BLB, avoiding voltage fluctuations of the bit line and the complementary bit line, and stably canceling the offset noise in the sense amplification structure.

For the control component, in one example, the control component includes: a first control unit 101 provided with one end connected to the second readout bit line ISABL and the other end for receiving the bias voltage VBIAS, and configured to provide the bias voltage VBIAS to the first PMOS transistor <P1> according to the control signal; and a second control unit 102 provided with one end connected to the second complementary readout bit line ISABLB and the other end for receiving the bias voltage VBIAS, and configured to provide the bias voltage VBIAS to the second PMOS transistor <P2> according to the control signal.

In one example, the control signal is the same as the offset canceling signal OC. That is, the control component 100 is turned on according to the offset canceling signal OC. By configuring the control signal to be the same as the offset canceling signal OC, the control component 100 and the offset cancellation component are synchronized to cancel the offset of the sense amplification circuit, which is as shown in FIG. 1.

In one example, the control signal includes a first control signal and a second control signal, where the first control unit 101 is turned on based on the first control signal, and the second control unit 102 is turned on based on the second control signal. That is, the first control unit 101 provides the bias voltage VBIAS to the first PMOS transistor <P1> through the first control signal, and the second control unit 102 provides the bias voltage VBIAS to the second PMOS transistor <P2> through the second control signal. The first control unit and the second control unit are respectively controlled through different control signals, thereby further achieving accurate control to the control component 100.

In some embodiments, the first control unit 101 includes a first control MOS transistor <11> provided with a source connected to the second readout bit line ISABL, a gate for receiving the first control signal, and a drain for receiving the bias voltage VBIAS. The second control unit 102 includes a second control MOS transistor <12> provided with a source connected to the second complementary readout bit line ISABLB, a gate for receiving the second control signal, and a drain for receiving the bias voltage VBIAS.

In one example, the control component can also provide the bias voltage VBIAS to the first PMOS transistor <P1> and the second PMOS transistor <P2> simultaneously through the same control unit. The bias voltage VBIAS is provided by the same control unit, thereby reducing the layout area of the sense amplification circuit, and facilitating the improvement of the integration level of the memory.

For the offset cancellation component, referring to FIG. 1, the offset cancellation component includes: a first offset cancellation MOS transistor <31> provided with a source connected to the initial bit line BL, a drain connected to the first complementary readout bit line SABLB, and a gate for receiving the offset canceling signal OC, and configured to electrically connect the initial bit line BL with the first complementary readout bit line SABLB according to the offset canceling signal OC; and a second offset cancellation MOS transistor <32> provided with a source connected to the initial complementary bit line BLB, a drain connected to the first readout bit line SABL, and a gate for receiving the offset canceling signal OC, and configured to electrically connect the initial complementary bit line BLB to the first readout bit line SABL according to the offset canceling signal OC.

In this embodiment, the sense amplification structure further includes: a first isolation unit 201 provided with one end connected to the first readout bit line SABL and the other end connected to the second readout bit line ISABL, and configured to electrically connect the first readout bit line SABL to the second readout bit line ISABL according to a first isolation signal (ISO1); and a second isolation unit 202 provided with one end connected to the first complementary readout bit line SABLB and the other end connected to the second complementary readout bit line ISABLB, and configured to electrically connect the first complementary readout bit line SABLB to the second complementary readout bit line ISABLB according to the first isolation signal (ISO1).

In some embodiments, the first isolation unit 201 includes a first isolation MOS transistor <21> provided with a source connected to the first readout bit line SABL, a drain connected to the second readout bit line ISABL, and a gate for receiving the first isolation signal ISO1; and the second isolation unit 202 includes a second isolation MOS transistor <22> provided with a source connected to the first complementary readout bit line SABLB, a drain connected to the second complementary readout bit line ISABLB, and a gate for receiving the first isolation signal ISO1.

The sense amplification circuit provides the first isolation signal ISO1 in the precharge stage to precharge the second readout bit line ISABL and the second complementary readout bit line ISABLB, and provides the first isolation signal ISO1 in the sense amplification stage, so that the gate of the first PMOS transistor <P1> is connected to the first readout bit line SABL, and the gate of the second PMOS transistor <P2> is connected to the first complementary readout bit line SABLB.

At this time, for the first PMOS transistor <P1> and the first NMOS transistor <N1>, since the connection relationship between the gate of the first PMOS transistor <P1> and the gate of the first NMOS transistor <N1> is the same, that is, when the first PMOS transistor <P1> or the first NMOS transistor <N1> is turned on based on different levels of the second readout bit line ISABL, there is only one MOS transistor that is turned on in the first PMOS transistor <P1> and the first NMOS transistor <N1>; and for the second PMOS transistor <P2> and the second NMOS transistor <N2>, since the connection relationship between the gate of the second PMOS transistor <P2> and the gate of the second NMOS transistor <N2> is the same, that is, when the second PMOS transistor <P2> or the second NMOS transistor <N2> is turned on based on different levels of the second complementary readout bit line ISABLB, there is only one MOS transistor that is turned on in the second PMOS transistor <P2> and the second NMOS transistor <N2>.

In some embodiments, after the second PMOS transistor <P2> is turned on, the first signal terminal is communicated with the first readout bit line SABL, so that the first readout bit line SABL is pulled up to the first level signal PCS, the initial bit line BL is pulled up to the first level signal PCS, and the data read out by the memory through the initial bit line BL is at a high level of the first level signal PCS corresponding to logic "1"; after the first NMOS transistor <N1> is turned on, the second signal terminal is communicated with the first complementary readout bit line SABLB, so that the first complementary readout bit line SABLB is pulled down to the second level signal NCS, the initial complementary bit line BLB is pulled down to the second level signal NCS, and the data read out by the memory through the initial complementary bit line BLB is at a low level of the second level signal NCS corresponding to logic "0"; and after the first PMOS transistor <P1> is turned on, the first signal terminal is communicated with the first complementary readout bit line SABLB, so that the first complementary readout bit line SABLB is pulled up to the first level signal PCS, the initial complementary bit line BLB is pulled up to the first level signal PCS, and the data read out by the memory through the initial complementary bit line BLB is at a high level of the first level signal PCS corresponding to logic "1"; and after the second NMOS transistor <N2> is turned on, the second signal terminal is communicated with the first readout bit line SABL, so that the first readout bit line SABL is pulled down to the second level signal NCS, the initial bit line BL is pulled down to the second level signal NCS, and the data read out by the memory through the initial bit line BL is at a low level of the second level signal NCS corresponding to logic "0".

In this embodiment, the sense amplification structure further includes: a third isolation unit 203 provided with one end connected to the initial bit line BL and the other end connected to the first readout bit line SABL, and configured to electrically connect the initial bit line BL to the first readout bit line SABL according to a second isolation signal (ISO2); and a fourth isolation unit 204 provided with one end connected to the initial complementary bit line BLB and the other end connected to the first complementary readout bit line SABLB, and configured to electrically connect the initial complementary bit line BLB to the first complementary readout bit line SABLB according to the second isolation signal (ISO2).

The third isolation unit 203 includes a third isolation MOS transistor <23> provided with a source connected to the initial bit line BL, a drain connected to the first readout bit line SABL, and a gate for receiving the second isolation signal (ISO2). The fourth isolation unit 204 includes a fourth isolation MOS transistor <24> provided with a source connected to the initial complementary bit line BLB, a drain connected to the first complementary readout bit line SABLB, and a gate for receiving the second isolation signal (ISO2).

The sense amplification circuit provides the second isolation signal ISO2 in the offset cancellation stage and the amplification stage, so as to realize the charge sharing between the initial bit line BL and the first readout bit line SABL, and between the initial complementary bit line BLB and the first complementary bit line SABLB.

In this embodiment, the sense amplification structure further includes: an equalization unit 401 provided with one end connected to the first readout bit line SABL and the other end connected to the first complementary readout bit line SABLB, and configured to make a voltage of the first readout bit line SABL be the same as a voltage of the first complementary readout bit line SABLB according to an equalization signal (EQ).

In some embodiments, the equalization unit 401 includes an equalization MOS transistor <41> provided with a source connected to the first readout bit line SABL, a drain connected to the first complementary readout bit line SABLB, and a gate for receiving the equalization signal EQ.

It should be noted that, the specific connection manner of the "source" and "drain" of each transistor above does not limit this embodiment. In other embodiments, a connection manner in which the "source" is replaced with the "drain", and the "drain" is replaced with the "source" may be used.

When the control component is turned on based on the control signal, the bias voltage is provided to the gate of the first PMOS transistor and the gate of the second PMOS transistor, the first PMOS transistor is turned on based on the bias voltage, the first signal terminal is electrically connected to the first complementary readout bit line, the first level signal is transmitted to the first complementary readout bit line, the second PMOS transistor is turned on based on the bias voltage, the first signal terminal is electrically connected to the first readout bit line, and the first level signal is transmitted to the first readout bit line, thereby canceling offsets of the PMOS transistors. After the offset cancellation component is turned on based on the offset canceling signal, the initial bit line and the first complementary readout bit line are electrically connected and share a voltage, the initial complementary bit line and the first readout bit line are electrically connected and share a voltage, the voltage of the initial bit line serves as a gate voltage of the first NMOS transistor for turning on the first NMOS transistor, the second signal terminal is electrically connected to the first complementary readout bit line, the second level signal is transmitted to the first complementary readout bit line, the voltage of the initial complementary bit line serves as a gate voltage of the second NMOS transistor for turning on the second NMOS transistor, the second signal terminal is electrically connected to the first readout bit line, and the second level signal is transmitted to the first readout bit line, thereby canceling offsets of the NMOS transistors. The first PMOS transistor and the second PMOS transistor are turned on based on a stable bias voltage, i.e., keeping the voltage of the first readout bit line and the voltage of the first complementary readout bit line stable, thereby further stabilizing the voltage of the initial bit line and the voltage of the initial complementary bit line, avoiding voltage fluctuations of the bit line and the complementary bit line, and stably canceling an offset noise in the sense amplification structure.

Another embodiment of the present disclosure provides a memory architecture, including: a plurality of memory arrays arranged in an initial bit line extension direction and a word line extension direction, the initial bit line extension direction being perpendicular to the word line extension direction; the sense amplification structure according to the above embodiment, provided between two adjacent ones of the memory arrays in the initial bit line extension direction, where the sense amplification structure is connected to a memory cell in one of the two adjacent memory arrays through an initial bit line, and is connected to a memory cell in the other of the two adjacent memory arrays through an initial complementary bit line; and a control component provided between the two adjacent memory arrays in the word line extension direction, and configured to provide a data readout signal, a control signal, and a bias voltage to the sense amplification structure.

Figure 2:
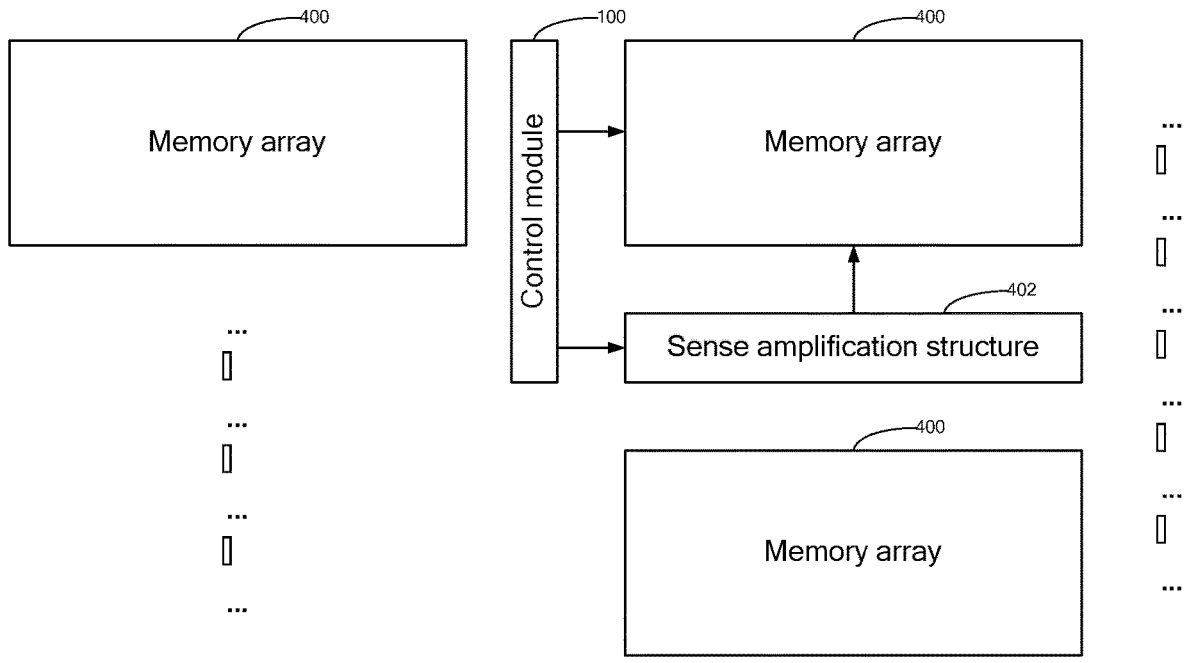
FIG. 2 is a schematic diagram of structural layout of a memory architecture according to another embodiment of the present disclosure.
Figure 3:
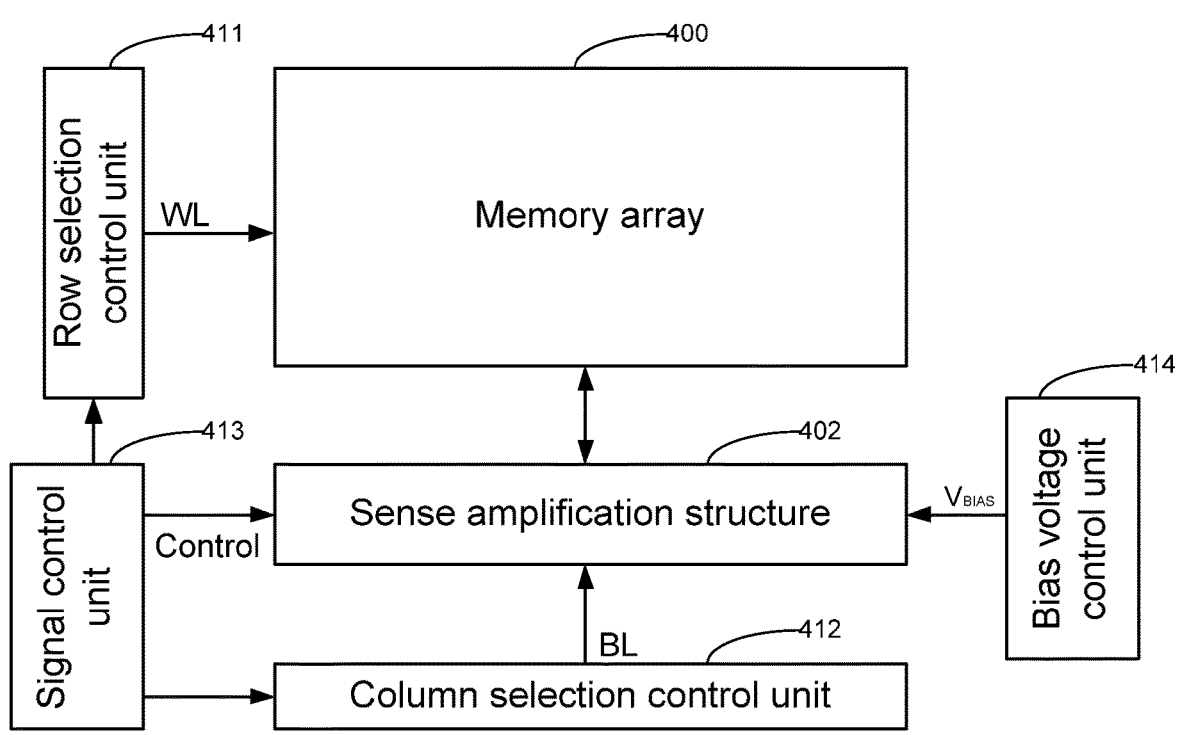
FIG. 3 is a schematic diagram of a specific structure of a memory architecture according to another embodiment of the present disclosure.

FIG. 2 is a schematic diagram of structural layout of a memory architecture according to this embodiment, and FIG. 3 is a schematic diagram of a specific structure of a memory architecture according to this embodiment. The memory architecture provided in each embodiment of the present disclosure is further described below in detail with reference to the accompanying drawings, and the details are as follows:

Referring to FIG. 2 and FIG. 3, the memory architecture includes: The plurality of memory arrays 400 are arranged in the initial bit line BL extension direction and the word line WL extension direction.

In some embodiments, the initial bit line BL extension direction is perpendicular to the word line WL extension direction. Referring to FIG. 3, the initial bit line BL extension direction is longitudinal, and the word line WL extension direction is transverse.

The sense amplification structure 402 provided by the above embodiment is arranged between two adjacent ones of the memory arrays 400 in the initial bit line BL extension direction. The sense amplification structure 402 is connected to a memory cell in one of the two adjacent memory arrays 400 through the initial bit line BL, and is connected to a memory cell in the other of the two adjacent memory arrays 400 through the initial complementary bit line BLB.

The control component 100 is arranged between the two adjacent memory arrays 400 in the word line WL extension direction, and is configured to provide the data readout signal, the control signal, and the bias voltage to the sense amplification structure.

The control signal is configured to turn on the first control MOS transistor <11> and the second control MOS transistor <12>. When the bias voltage VBIAS is configured to turn on the first control MOS transistor <11> and the second control MOS transistor <12>, a gate turn-on voltage is provided to the PMOS transistor of the sense amplification structure.

In some embodiments, referring to FIG. 1, the data readout signal includes at least one of the offset canceling signal OC, the first isolation signal ISO1, the second isolation signal ISO2, and the equalization signal EQ.

The first isolation signal ISO1 is configured to turn on the first isolation MOS transistor <21> and the second isolation MOS transistor <22>. The second isolation signal ISO2 is configured to turn on the third isolation MOS transistor <23> and the fourth isolation MOS transistor <24>. The offset canceling signal OC is configured to turn on the first offset cancellation MOS transistor <31> and the second offset cancellation MOS transistor <32>. The equalization signal EQ is configured to turn on the equalization MOS transistor <41>.

In one example, the control signal is the same as the offset canceling signal OC. That is, the control component 100 is turned on according to the offset canceling signal OC. By configuring the control signal to be the same as the offset canceling signal OC, the control component 100 and the offset cancellation component are synchronized to cancel the offset of the sense amplification circuit.

In some embodiments, referring to FIG. 2 and FIG. 3, the control component 100 includes: a signal control unit 413 configured to provide the readout signal and the control signal to the sense amplification structure; and a bias voltage control unit 414 configured to provide the bias voltage to the sense amplification structure.

In the word line WL extension direction, the signal control unit 413 and the bias voltage control unit 414 are arranged on two opposite sides of the sense amplification structure 402.

In this embodiment, the control component 100 further includes: a column selection control unit 412 configured to provide a column selection signal for turning on some of the initial bit lines BL or the initial complementary bit lines BLB in the memory arrays 400; and a row selection control unit 411 configured to provide a row selection signal for turning on some word lines WL in the memory arrays 400. That is, the column selection control unit 412 is configured to select the corresponding bit line BL according to the column selection signal so as to select the corresponding memory cell, and the row selection control unit 411 is configured to select the corresponding word line WL according to the row selection signal so as to select the corresponding memory cell.

The embodiments or implementations of this specification are described in a progressive manner, and each embodiment focuses on differences from other embodiments. The same or similar parts between the embodiments may refer to each other.

In the description of the specification, the description with reference to terms such as "an embodiment", "an exemplary embodiment", "some implementations", "a schematic implementation", and "an example" means that the specific feature, structure, material, or characteristic described in combination with the implementation(s) or example(s) is included in at least one implementation or example of the present disclosure.

In this specification, the schematic expression of the above terms does not necessarily refer to the same implementation or example. Moreover, the described specific feature, structure, material or characteristic may be combined in an appropriate manner in any one or more implementations or examples.

It should be noted that in the description of the present disclosure, the terms such as "center", "top", "bottom", "left", "right", "vertical", "horizontal", "inner" and "outer" indicate the orientation or position relationships based on the drawings. These terms are merely intended to facilitate description of the present disclosure and simplify the description, rather than to indicate or imply that the mentioned apparatus or element must have a specific orientation and must be constructed and operated in a specific orientation. Therefore, these terms should not be construed as a limitation to the present disclosure.

It can be understood that the terms such as "first" and "second" used in the present disclosure can be used to describe various structures, but these structures are not limited by these terms. Instead, these terms are merely intended to distinguish one element from another.

The same elements in one or more drawings are denoted by similar reference numerals. For the sake of clarity, various parts in the drawings are not drawn to scale. In addition, some well-known parts may not be shown. For the sake of brevity, the structure obtained by implementing multiple steps may be shown in one figure. In order to make the understanding of the present disclosure more clearly, many specific details of the present disclosure, such as the structure, material, size, processing process, and technology of the device, are described below. However, as those skilled in the art can understand, the present disclosure may not be implemented according to these specific details.

Finally, it should be noted that the above embodiments are merely intended to explain the technical solutions of the present disclosure, rather than to limit the present disclosure. Although the present disclosure is described in detail with reference to the above embodiments, those skilled in the art should understand that they may still modify the technical solutions described in the above embodiments, or make equivalent substitutions of some or all of the technical features recorded therein, without deviating the essence of the corresponding technical solutions from the scope of the technical solutions of the embodiments of the present disclosure.

INDUSTRIAL APPLICABILITY

In the sense amplification structure and the memory architecture provided by the embodiments of the present disclosure, when the control component is turned on based on the control signal, the bias voltage is provided to the gate of the first PMOS transistor and the gate of the second PMOS transistor, the first PMOS transistor is turned on based on the bias voltage, the first signal terminal is electrically connected to the first complementary readout bit line, the first level signal is transmitted to the first complementary readout bit line, the second PMOS transistor is turned on based on the bias voltage, the first signal terminal is electrically connected to the first readout bit line, and the first level signal is transmitted to the first readout bit line, thereby canceling offsets of the PMOS transistors. After the offset cancellation component is turned on based on the offset canceling signal, the initial bit line and the first complementary readout bit line are electrically connected and share a voltage, the initial complementary bit line and the first readout bit line are electrically connected and share a voltage, the voltage of the initial bit line serves as a gate voltage of the first NMOS transistor for turning on the first NMOS transistor, the second signal terminal is electrically connected to the first complementary readout bit line, the second level signal is transmitted to the first complementary readout bit line, the voltage of the initial complementary bit line serves as a gate voltage of the second NMOS transistor for turning on the second NMOS transistor, the second signal terminal is electrically connected to the first readout bit line, and the second level signal is transmitted to the first readout bit line, thereby canceling offsets of the NMOS transistors. The first PMOS transistor and the second PMOS transistor are turned on based on a stable bias voltage, i.e., keeping the voltage of the first readout bit line and the voltage of the first complementary readout bit line stable, thereby further stabilizing the voltage of the initial bit line and the voltage of the initial complementary bit line, avoiding voltage fluctuations of the bit line and the complementary bit line, and stably canceling an offset noise in the sense amplification structure.

The invention claimed is:

1. A sense amplification structure provided between two adjacent memory arrays, comprising:
   a first P-channel metal oxide semiconductor (PMOS) transistor provided with a gate connected to a second readout bit line and a source connected to a first signal terminal;
   a first N-channel metal oxide semiconductor (NMOS) transistor provided with a gate connected to an initial bit line and a source connected to a second signal terminal;
   a drain of the first PMOS transistor and a drain of the first NMOS transistor being connected to a first complementary readout bit line, wherein the first signal terminal is configured to receive a first level signal, and the second signal terminal is configured to receive a second level signal;
   a second PMOS transistor provided with a gate connected to a second complementary readout bit line and a source connected to the first signal terminal;
   a second NMOS transistor provided with a gate connected to an initial complementary bit line and a source connected to the second signal terminal;
   a drain of the second PMOS transistor and a drain of the second NMOS transistor being connected to a first readout bit line, wherein the initial bit line is connected to a memory cell in one of the two adjacent memory arrays, and the initial complementary bit line is connected to a memory cell in the other of the two adjacent memory arrays;
   an offset cancellation component partially connected between the initial bit line and the first complementary readout bit line, partially connected between the initial complementary bit line and the first readout bit line, and configured to electrically connect the initial bit line to the first complementary readout bit line and electrically connect the initial complementary bit line to the first readout bit line according to an offset canceling signal; and a control component connected to the second readout bit line and the second complementary readout bit line, and configured to provide a bias voltage to the first PMOS transistor and the second PMOS transistor according to a control signal.

2. The sense amplification structure according to claim 1, wherein the control signal is the same as the offset canceling signal.

3. The sense amplification structure according to claim 1, wherein the control signal comprises a first control signal and a second control signal; and the control component comprises:

a first control unit provided with one end connected to the second readout bit line and the other end for receiving the bias voltage, and configured to provide the bias voltage to the first PMOS transistor according to the first control signal; and a second control unit provided with one end connected to the second complementary readout bit line and the other end for receiving the bias voltage, and configured to provide the bias voltage to the second PMOS transistor according to the second control signal.

4. The sense amplification structure according to claim 3, wherein the first control unit comprises a first control metal oxide semiconductor (MOS) transistor; the second control unit comprises a second control MOS transistor;

the first control MOS transistor is provided with a source connected to the second readout bit line, a gate for receiving the first control signal, and a drain for receiving the bias voltage; and the second control MOS transistor is provided with a source connected to the second complementary readout bit line, a gate for receiving the second control signal, and a drain for receiving the bias voltage.

5. The sense amplification structure according to claim 1, further comprising:

a first isolation unit provided with one end connected to the first readout bit line and the other end connected to the second readout bit line, and configured to electrically connect the first readout bit line to the second readout bit line according to a first isolation signal; and a second isolation unit provided with one end connected to the first complementary readout bit line and the other end connected to the second complementary readout bit line, and configured to electrically connect the first complementary readout bit line to the second complementary readout bit line according to the first isolation signal.

6. The sense amplification structure according to claim 5, wherein the first isolation unit comprises a first isolation metal oxide semiconductor (MOS) transistor; the second isolation unit comprises a second isolation MOS transistor;

the first isolation MOS transistor is provided with a source connected to the first readout bit line, a drain connected to the second readout bit line, and a gate for receiving the first isolation signal; and the second isolation MOS transistor is provided with a source connected to the first complementary readout bit line, a drain connected to the second complementary readout bit line, and a gate for receiving the first isolation signal.

7. The sense amplification structure according to claim 1, further comprising:

a third isolation unit provided with one end connected to the initial bit line and the other end connected to the first readout bit line, and configured to electrically connect the initial bit line to the first readout bit line according to a second isolation signal; and a fourth isolation unit provided with one end connected to the initial complementary bit line and the other end connected to the first complementary readout bit line, and configured to electrically connect the initial complementary bit line to the first complementary readout bit line according to the second isolation signal.

8. The sense amplification structure according to claim 7, wherein the third isolation unit comprises a third isolation metal oxide semiconductor (MOS) transistor; the fourth isolation unit comprises a fourth isolation MOS transistor;

the third isolation MOS transistor is provided with a source connected to the initial bit line, a drain connected to the first readout bit line, and a gate for receiving the second isolation signal; and the fourth isolation MOS transistor is provided with a source connected to the initial complementary bit line, a drain connected to the first complementary readout bit line, and a gate for receiving the second isolation signal.

9. The sense amplification structure according to claim 1, further comprising: an equalization unit provided with one end connected to the first readout bit line and the other end connected to the first complementary readout bit line, and configured to make a voltage of the first readout bit line be the same as a voltage of the first complementary readout bit line according to an equalization signal.

10. The sense amplification structure according to claim 9, wherein the equalization unit comprises an equalization metal oxide semiconductor (MOS) transistor provided with a source connected to the first readout bit line, a drain connected to the first complementary readout bit line, and a gate for receiving the equalization signal.

11. The sense amplification structure according to claim 1, wherein the offset cancellation component comprises:

a first offset cancellation metal oxide semiconductor (MOS) transistor provided with a source connected to the initial bit line, a drain connected to the first complementary readout bit line, and a gate for receiving the offset canceling signal, and configured to electrically connect the initial bit line to the first complementary readout bit line according to the offset canceling signal; and a second offset cancellation MOS transistor provided with a source connected to the initial complementary bit line, a drain connected to the first readout bit line, and a gate for receiving the offset canceling signal, and configured to electrically connect the initial complementary bit line to the first readout bit line according to the offset canceling signal.

12. A memory architecture, comprising:

a plurality of memory arrays arranged in an initial bit line extension direction and a word line extension direction, the initial bit line extension direction being perpendicular to the word line extension direction;

a sense amplification structure according to claim 1, provided between two adjacent ones of the memory arrays in the initial bit line extension direction, wherein the sense amplification structure is connected to a memory cell in one of the two adjacent memory arrays through an initial bit line, and is connected to a memory cell in the other of the two adjacent memory arrays through an initial complementary bit line; and a control component provided between the two adjacent memory arrays in the word line extension direction, and configured to provide a data readout signal, a control signal, and a bias voltage to the sense amplification structure.

13. The memory architecture according to claim 12, wherein the data readout signal comprises at least one of an offset canceling signal, a first isolation signal, a second isolation signal, and an equalization signal; and the control component comprises:
   a signal control unit configured to provide the data readout signal and the control signal to the sense amplification structure; and
   a bias voltage control unit configured to provide the bias voltage to the sense amplification structure.

14. The memory architecture according to claim 13, wherein the signal control unit and the bias voltage control unit are arranged on two opposite sides of the sense amplification structure.

15. The memory architecture according to claim 13, wherein the control signal is the same as the offset canceling signal.

16. The memory architecture according to claim 12, wherein the control component further comprises:
   a column selection control unit configured to provide a column selection signal for turning on some of the initial bit lines or the initial complementary bit lines in the memory arrays; and
   a row selection control unit configured to provide a row selection signal for turning on some word lines in the memory arrays.

* * * * *